US008198151B2

(12) United States Patent
Lin et al.

(10) Patent No.: US 8,198,151 B2
(45) Date of Patent: Jun. 12, 2012

(54) METHOD FOR FABRICATING A METAL GATE STRUCTURE

(75) Inventors: Chien-Ting Lin, Hsin-Chu (TW);
Che-Hua Hsu, Hsin-Chu Hsien (TW);
Li-Wei Cheng, Hsin-Chu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 246 days.

(21) Appl. No.: 12/890,725

(22) Filed: Sep. 27, 2010

(65) Prior Publication Data

US 2011/0014773 A1 Jan. 20, 2011

Related U.S. Application Data

(62) Division of application No. 12/101,160, filed on Apr. 11, 2008, now Pat. No. 7,838,366.

(51) Int. Cl.
*H01L 21/8238* (2006.01)

(52) U.S. Cl. .. 438/199; 438/216; 438/296; 257/E21.453

(58) Field of Classification Search .................. 438/199, 438/259, 270, 294, 296, 587, 591, 216; 257/E21.543
See application file for complete search history.

(56) References Cited

U.S. PATENT DOCUMENTS

| 5,563,096 | A | 10/1996 | Nasr |
| 5,950,090 | A | 9/1999 | Chen |
| 7,569,443 | B2 | 8/2009 | Kavalieros |
| 2007/0215950 | A1 * | 9/2007 | Aoyama ........................ 257/369 |
| 2008/0128825 | A1 | 6/2008 | Sato |
| 2009/0057769 | A1 | 3/2009 | Wei |
| 2009/0181504 | A1 | 7/2009 | Lin |

OTHER PUBLICATIONS

C. Chen et al., "A Novel 0.25 µm Shallow Trench Isolation Technology", 1996, IEEE.

* cited by examiner

*Primary Examiner* — Thanhha Pham
(74) *Attorney, Agent, or Firm* — Winston Hsu; Scott Margo

(57) ABSTRACT

A method of fabricating a metal gate structure is provided. The method includes providing a semiconductor substrate with a planarized polysilicon material; patterned the planarized polysilicon material to form at least a first gate and a second gate, wherein the first gate is located on the active region and the second gate at least partially overlaps with the isolation region; forming an inter-layer dielectric material covering the gates; planarizing the inter-layer dielectric material until exposing the gates and forming an inter layer-dielectric layer; performing an etching process to remove the gates to form a first recess and a second recess within the inter-layer dielectric layer; forming a gate dielectric material on a surface of each of the recesses; forming at least a metal material within the recesses; and performing a planarization process.

24 Claims, 7 Drawing Sheets

METHOD FOR FABRICATING A METAL GATE STRUCTURE

CROSS REFERENCE TO RELATED APPLICATIONS

This application is a division of U.S. application Ser. No. 12/101,160 filed Apr. 11, 2008, and incorporated herein by reference in its entirety.

BACKGROUND OF THE INVENTION

1. Field of the Invention

The present invention relates to a method of fabricating a gate structure, and more particularly, to a method of fabricating a metal gate structure.

2. Description of the Prior Art

With a trend towards scaling down the complementary metal oxide semiconductor (CMOS) size, conventional methods used to achieve optimization, such as reducing thickness of the gate dielectric layer, for example the thickness of silicon dioxide layer, have faced problems such as leakage current due to tunneling effect. In order to keep progression to next generation, high-K materials are used to replace the conventional silicon oxide (SiO2) or silicon-oxy-nitride (SiON) to be the gate dielectric layer because it decreases physical limit thickness effectively, reduces leakage current, and obtains equivalent capacitor in an identical equivalent oxide thickness (EOT).

Additionally, current metal-oxide-semiconductor field-effect transistors (MOSFETs) often utilize polysilicon to make a gate. A doped polysilicon gate has problems, however, such as a depletion effect of the polysilicon gate, and boron penetrates through the channel.

Take the depletion effect of the poly-silicon gate as an example. When the polysilicon gate is in an inversion, carrier depletion occurs between the polysilicon gate and the gate dielectric layer. If this polysilicon gate has the afore-mentioned depletion effect, the effect of the gate capacitance will decrease, but a high quality metal oxide semiconductor transistor (MOS transistor) should have a high gate capacitance. If the gate capacitance is high, more electric charge will accumulate in two sides of the gate capacitance. More electric charge therefore accumulates in the channel, so when the metal oxide semiconductor transistor (MOS transistor) has a bias voltage, the speed of the electric current between the source/drain will be improved.

To avoid the above-mentioned depletion effect and boron penetrates of the polysilicon gate; the current industry devotes to investigate into utilizing a metal gate to replace the polysilicon gate, namely, utilizing metal materials to replace the polysilicon materials used in the polysilicon gate, so as to resolve the aforesaid problems and also to decrease the resistivity of the gate.

Therefore, plenty of new metal materials have been found. For example, double work function metals are used to replace the conventional polysilicon gate to be the control electrode that competent to the high-K gate dielectric layer. Besides, critical requirements for those metal materials include thermal stability with the gate dielectric and suitable values for the interfacial work function (~4.0 eV and ~5.0 eV for bulk-Si NMOS and PMOS devices respectively). Accordingly, how to combine those metal gates with the current manufacture process of the MOS transistors has become another important challenge for the current industry.

SUMMARY OF THE INVENTION

The present invention relates to a method of fabricating a gate structure, and more particularly, to a method of fabricating a metal gate structure.

According to the claims of the present invention, a method of fabricating a metal gate structure is provided. The method includes providing a semiconductor substrate, the semiconductor substrate defining at least an isolation region and at least an active region; forming a polysilicon material on the semiconductor substrate; planarizing the polysilicon material to form a planarized polysilicon material; patterned the planarized polysilicon material to form at least a gate on the isolation region and the active region, respectively first gate and a second gate on the semiconductor substrate, wherein the first gate is located on the active region and the second gate at least partially overlaps with the isolation region; forming an inter-layer dielectric material covering the gates on the semiconductor substrate; planarizing the inter-layer dielectric material until exposing the gates and forming an inter layer-dielectric layer; performing an etching process to remove the gates to form a first recess and a second recess within the inter-layer dielectric layer; forming a gate dielectric material on a surface of each of the recesses; forming at least a metal material within the recesses; and performing a planarization process.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
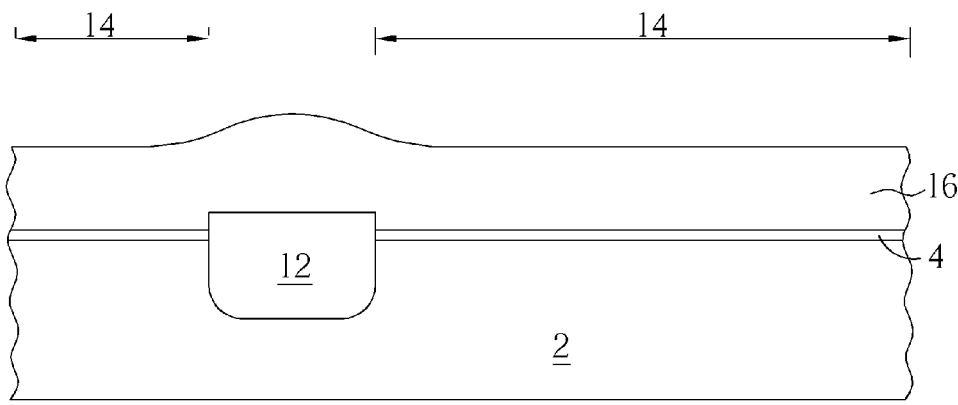
FIG. 1 to FIG. 9 are cross-sectional diagrams illustrating a method of fabricating a metal gate structure according to a first preferred embodiment of the present invention.

Please refer to FIG. 1 to FIG. 9, which are cross-sectional diagrams illustrating a method of fabricating a metal gate structure according to a first preferred embodiment of the present invention. As shown in FIG. 1, at first, a semiconductor substrate 2 is provided such as a silicon substrate or a silicon-on-insulator (SOI) substrate, etc. At least an isolation region 12 such as shallow trench isolation (STI) or a field oxide (FOX) is formed within the semiconductor substrate 2. The isolation region 12 is slightly higher than the surface of the semiconductor substrate 2 due to the standard fabrication of the isolation regions. For example, the standard process of forming isolation region includes: forming a liner oxide layer and hard mask layer in sequence; patterning the hard mask layer, the liner oxide layer, and the semiconductor substrate to form a trench within the semiconductor substrate; filling the trench with dielectric materials; planarizing the dielectric materials until exposing the hard mask layer; finally removing the hard mask layer to form the shallow trench isolation region 12. Next, a dielectric material 4 is formed on a portion surface of the semiconductor substrate 2, where the isolation region 12 is not included in, i.e. an active region 14. Subsequently, a polysilicon material 16, which covers the isolation region 12 and the dielectric material 4, is formed on the semiconductor substrate 2. In general, the dielectric material 4 is composed of isolating materials such as silicon oxide components or silicon nitride components. While the dielectric material 4 is silicon oxide components formed by thermal oxide growth process, it will grow selectively on the exposed silicon substrate. However, while the dielectric materials is composed of high-k dielectric materials formed by deposition process, it will cover the whole semiconductor substrate including the isolation region 12 (not shown). Besides, the polysilicon material 16 may be doped polysilicon formed by in-situ or ex-situ doping process, or un-doped polysilicon. It should be noticed that at least an N-type transistor region and at least a P-type transistor region may be defined on the active region 14 in accordance with different functional transistors, such as NMOS transistors or PMOS transistors, which will be formed on the different regions in the following processes (not shown); and doped wells may be formed in the suitable positions within the semiconductor substrate 2 (not shown).

Figure 2:
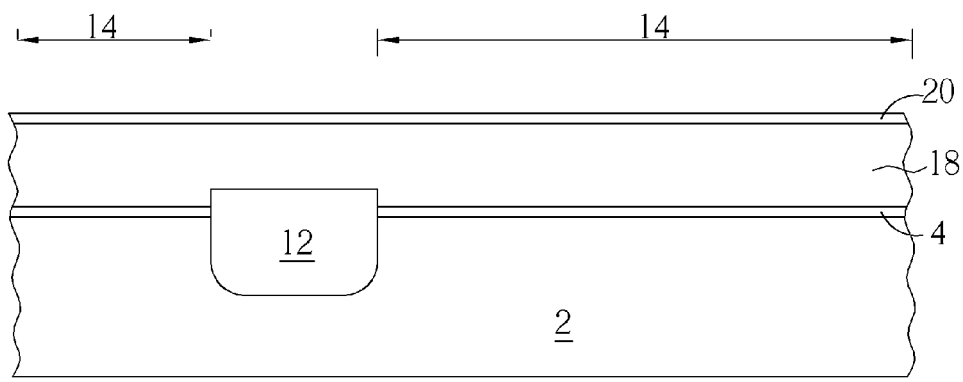

As shown in FIG. 2, a planarization process, such as a chemical mechanical polish (CMP) process, is performed on the polysilicon material 16, so as to form a planarized polysilicon material 18. A hard mask material 20 is then formed on the planarized polysilicon material 18. The hard mask material 20 may be composed of silicon nitride (SiN), silicon oxide(SiO2), silicon oxy-nitride (SiON) with higher etching-selectivity to silicon.

Figure 3:
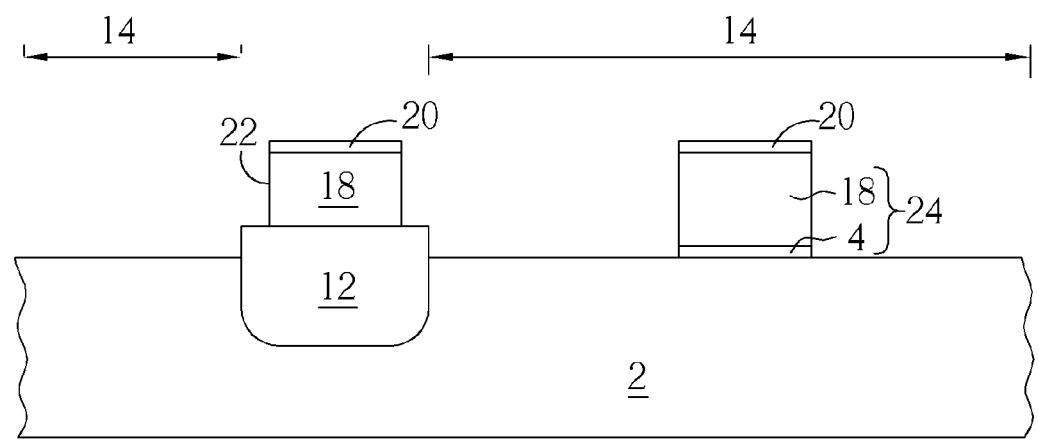

As shown in FIG. 3, photolithographic processes and etching processes are performed to etch the hard mask material 20, planarized polysilicon material 18, and the dielectric material 4, so as to form at least a second gate 22, and a first gate 24 on the isolation region 12 and the active region 14, respectively on semiconductor substrate 2, and hard mask layers 20 on the gate 22, 24, respectively. The first gate 24 on the active region 14 includes a dielectric layer 4 on the semiconductor substrate 2 and a polysilicon layer 18 on the dielectric layer 4. The second gate 22 comprises a polysilicon layer, which is formed by etching the planarized polysilicon material 18. Afterwards, an ion implantation process is performed to form lightly doped regions at the suitable positions within the semiconductor substrate 2 (not shown). It should be noticed that the first gate 24 on the active region 24 may be an N-type gate or a P-type gate having different functions according to different integrated circuit designs (not shown). Furthermore, at least an N-type gate and at least a P-type gate (not shown) may be formed on the N-type transistor region and the P-type transistor region (not shown), respectively according to different integrated circuit designs and demands. In addition, the second gate 22 on the isolation region 12 is may be an extended portion of a gate of an adjacent transistor, a bridge portion between two gates of two adjacent transistors, an extending portion of a gate for improving line-end shortening effect, or just a linear segment of non-polysilicon or polysilicon used just as a resistor. The second gate 22 is not limited to be set all on the isolation region 12, it may also be partially set across on a portion of the isolation region 12 and be partially set on a portion of the active region 14. It should be noticed that although the second gate 22 is denominated "gate", it is not necessary to have the structure and the functions of a transistor. The term of gate here only refers to a patterned non-polysilicon, polysilicon, or metal segment.

Figure 4:
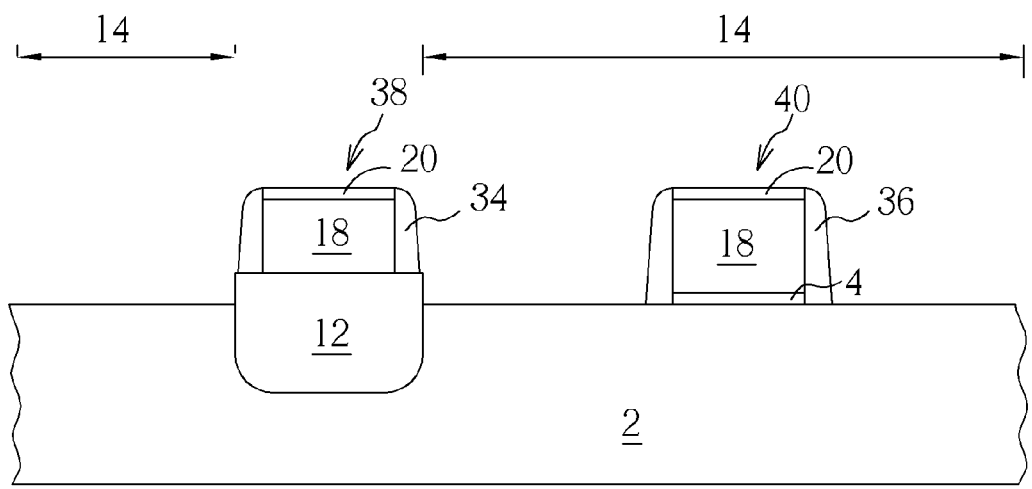

As shown in FIG. 4, deposition processes and etching processes are performed to form spacers 34, 36 on sidewalls of the gates 22, 24 and the hard mask layers 20 respectively, so as to form gate structures 38, 40. Subsequently, at least an ion implantation process is performed to form heavily doped regions, which is prepared for each transistor as demanded source/drain regions, at the suitable positions within the semiconductor substrate 2 (not shown). A metal silicide process, such as self-aligned silicide (salicide) process, may be optionally carried out to form metal silicides on the source/drain regions or the regions, which need to be electrically connected with the other regions formed in the following processes (not shown). This process is well known by those skilled in the art, and the details of which are not further explained herein for the sake of brevity. It should be noticed that as the active regions 14 includes at least an N-type gate and at least a P-type gate, thus an N-type gate structure and a P-type gate structure will be formed on the active region 14 after the deposition and the etching processes of forming spacers. Besides, the source/drain regions may be fabricated by some technologies, such as selective epitaxial growth (SEG), etc, but is not limited thereto, that numerous modifications and alterations of the method may be made while retaining the teachings of the invention. Furthermore, if the second gate is used as a resistor, it is not necessary to have the doped region and the metal silicide formed on the second gate.

Figure 5:
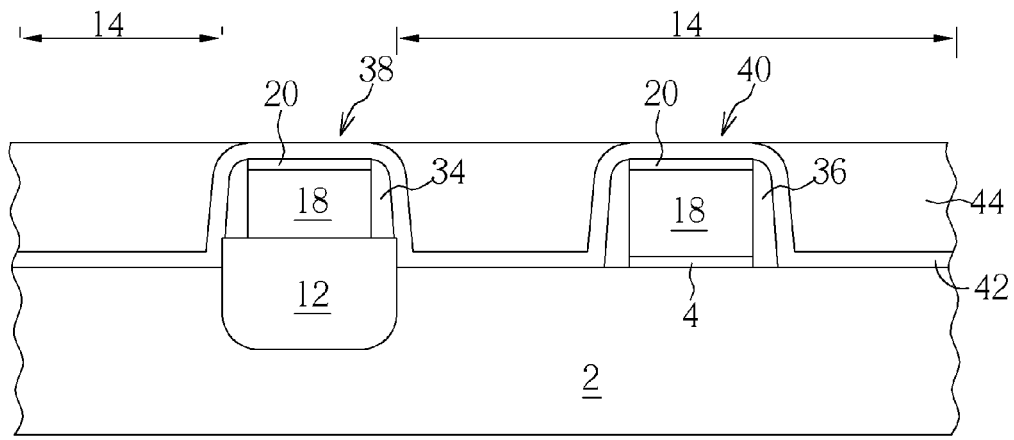

Afterwards, a deposition process is performed to form a cap layer 42, which is composed of silicon nitride or carbide components, etc, on the semiconductor substrate 2. Another deposition process is then performed to form an inter-layer dielectric (ILD) material, which is composed of isolating materials such as silicon oxide components, etc. Subsequently, a planarization process such as a chemical mechanical polish (CMP) process is carried out to form a planarized inter-layer dielectric (ILD) layer 44 on the semiconductor substrate 2 as shown in FIG. 5.

Figure 6:
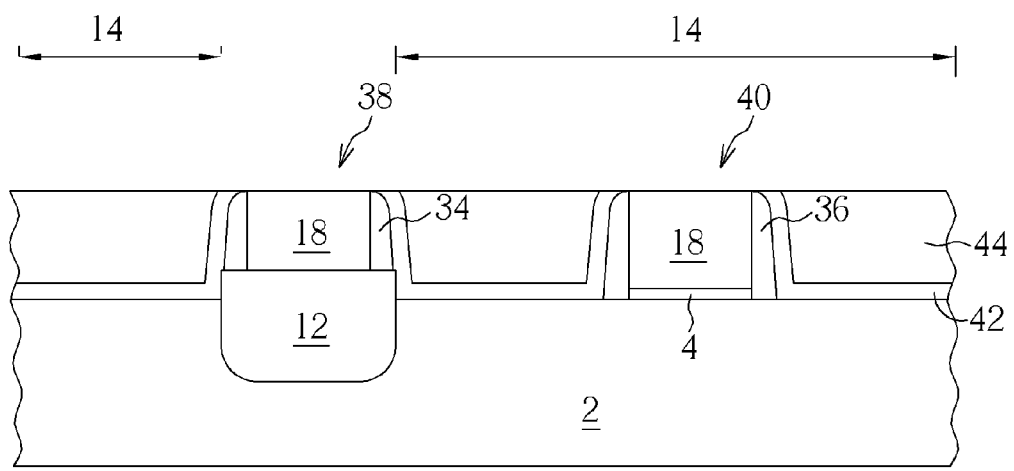

As shown in FIG. 6, at least an etching process is carried out to remove a portion of the cap layer 42, the hard mask layers 20, a portion of the spacers 34, 36, and a portion of the inter-layer dielectric (ILD) layer 44 is removed by the dry etching or chemical mechanical polish (CMP) process until the gates second gate 22 and, the first gate 24 within the gate structures 38, 40 are exposed.

Figure 7:
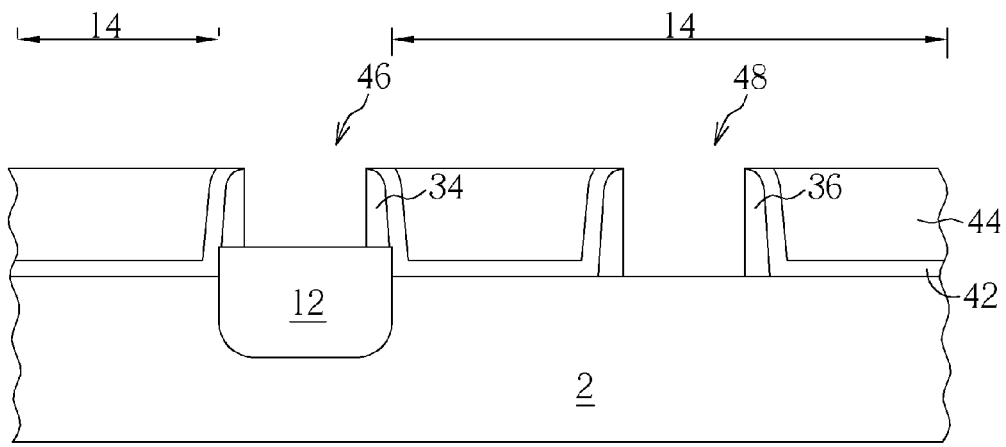

As shown in FIG. 7, at least an etching process, such as a dry or a wet etching process, is performed to remove the second gates 22, and the first gate 24 within the gate structures 38, 40, so as to form corresponding recesses 46, 48 within the planarized inter-layer dielectric layer 44. If the gate structure 38 is used as the resistor, the second gate 22 needn't to be removed. Under the circumstance, the polysilicon layer 18 may be selectively removed by covering the gate structure 38 with the photoresist. The other method is to differentiate the polysilicon layer of the gate structures 38 from the polysilicon layer of the gate structure 40 using the different dopants. In addition, if the dielectric material 4 is an oxide layer fabricated by the thermal oxide growth process, it can be removed with the method as shown in FIG. 7. However, if the dielectric material 4 is a high-K dielectric material, which is fabricated by the deposition process, it can be left for replacing the gate dielectric material 54, which is desired to be formed in the following processes (not shown).

Figure 8:
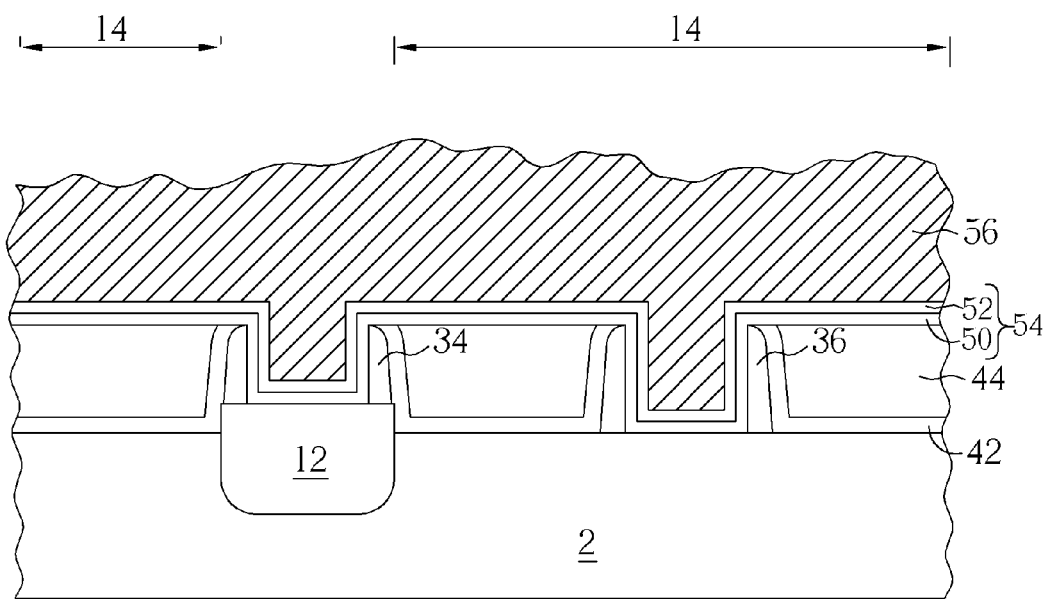

As shown in FIG. 8, at least a deposition process is carried out to form a gate dielectric material 54, which may further include some film layers such as a dielectric material 50 and a high-K dielectric material 52, etc, covering the inter-layer dielectric (ILD) layer 44, a portion of the spacers 34, 36, the isolation region 12 within the recess 46, and the semiconductor substrate 2 within the recess 48. However, the gate dielectric material 54 doesn't fill the recesses 46, 48. Afterwards, a deposition process is carried out to form a metal material 56, which fills the recesses 46, 48.

Figure 9:
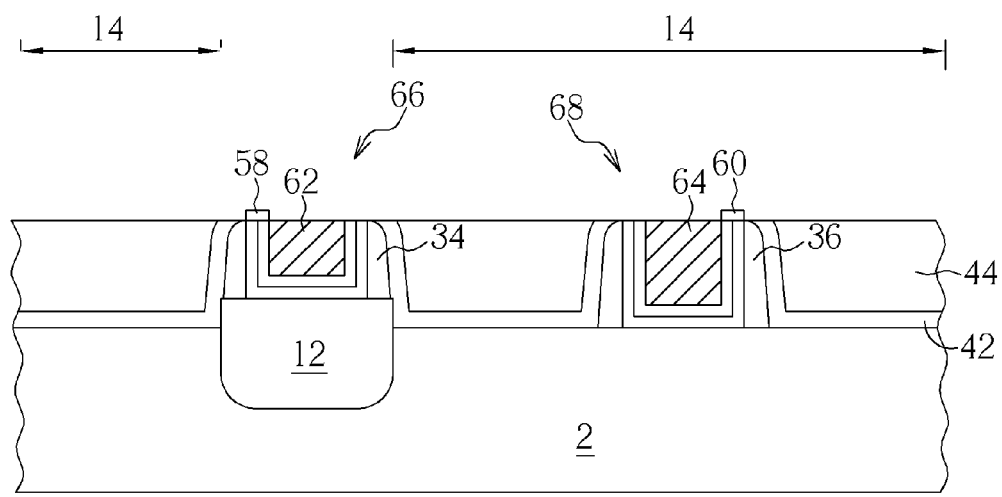

It should be noticed that the deposition processes as shown in FIG. 8 may vary with different integrated circuit designs and demands. When there are at least an N-type gate structure and at least a P-type gate structure formed on the active region 14, a recess will be formed within each of the N-type and P-type gate structure, respectively, after performing the step as shown in FIG. 7 of removing the gates within the gate structures (not shown). Next, an N-type metal material is formed on the semiconductor substrate 2 (not shown). The N-type metal material doesn't fill the recesses within the N-type and P-type gate structures. An etching process is then carried out to remove the N-type metal material within the recess of the P-type gate structure. Subsequently, a low resistivity P-type metal material (not shown) is formed on the semiconductor substrate 2 and the low resistivity P-type metal material fills the recesses within the N-type and P-type gate structures. Finally, a planarization process as shown in FIG. 9 is performed, which will be described in detail later.

In addition, a low resistivity metal material (not shown) may be formed on the semiconductor substrate 2 after forming the N-type metal material. The low resistivity metal material fills the recesses within the N-type and P-type gate structure. Therefore, while performing the etching process, both the N-type metal material and the low resistivity metal material within the recess of the P-type gate structure must be removed. Afterwards, a P-type metal material (not shown) is formed on the semiconductor substrate 2. The P-type metal material doesn't fill the recess within the P-type gate structure. Another low resistivity metal material (not shown) is then formed on semiconductor substrate 2. The low resistivity metal material fills the recesses within the N-type and the P-type gate structure. Finally, a planarization process as shown in FIG. 9 is carried out, which will be described in detail later.

Besides, it should also be noticed that the etching process and the deposition processes of the metal materials as shown in FIG. 7 to FIG. 8 are not limited to removing the N-type gate within the N-type gate structure and the P-type gate within the P-type gate structure simultaneously. The N-type gate within the N-type gate structure may be removed first to form a recess (not shown) within the N-type gate structure. A gate dielectric layer (not shown) is then formed on the surface of the recess. Subsequently, the recess is directly filled with an N-type metal material (not shown). Afterwards, the P-type gate is removed to form another recess (not shown) within the P-type gate structure. Similarly, another gate dielectric layer (not shown) is then formed on the surface of the recess. Subsequently, the recess is directly filled with a P-type metal material (not shown). Finally, a planarization process as shown in FIG. 9 is carried out, which will be described in detail later.

The aforesaid all kinds of methods of metal gate last fabrications are all not limited to carry out the steps of forming N-type gate before the steps of P-type gate. Those methods may also carry out the steps of P-type gate before the steps of N-type gate, etc, that numerous modifications and alterations of the method may be made while retaining the teachings of the invention. The first gate 24 and the second gate 22 may both be N-type gates or may both be P-type gates. However, if one of the gates 22, 24 is N-type and the other is P-type may also be used as well.

According to the preferred embodiment of the present invention, the aforesaid P-type metal materials include titanium nitride (TiN), tungsten (W), tungsten nitride (WN), molybdenum nitride (MoN), and molybdenum aluminum nitride (MoAlN), platinum (Pt), nickel (Ni), and Ruthenium (Ru), etc. The aforesaid N-type metal materials include titanium aluminum nitride (TiAlN), tantalum carbide (TaC), and tantalum nitride (TaN), tantalum silicon nitride (TaSiN), and titanium aluminide (TiAl), etc. Furthermore, the aforesaid low resistivity metal materials include titanium aluminide (TiAl), aluminum (Al), tungsten (W), and cobalt tungsten phosphide (CoWP), etc.

Finally, at least a planarization process, such as chemical mechanical polishing (CMP) process, is performed to completely removed the metal material 56, gate dielectric material 54 disposed above the inter-layer dielectric (ILD) layer 44. As a result, second metal gate structures 66, and the first metal gate stricture 68 are formed on the isolation region 12 and the active region 14, respectively, as shown in FIG. 9. The second metal gate structure 66 includes a gate dielectric layer 58 and a metal layer 62; and the first metal gate structure 68 includes a gate dielectric layer 60 and a metal layer 64. Preferably, the height of the first metal gate structure 66 on the active region 14 and the height of the second metal gate structure 68 on the isolation region 12 are different.

Figure 10:
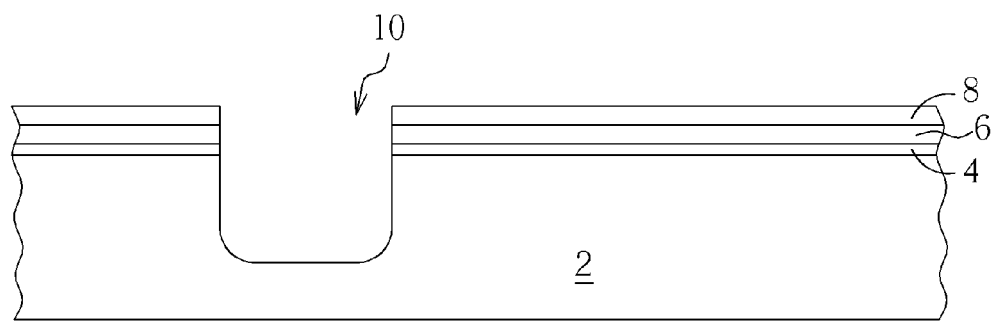
FIG. 10 to FIG. 13 are cross-sectional diagrams illustrating a method of fabricating a metal gate structure according to a second preferred embodiment of the present invention.

Please refer to FIG. 10 to FIG. 13, which are cross-sectional diagrams illustrating a second preferred embodiment of the present invention, where like elements, regions, or layers are designated with like numerals as shown in the first preferred embodiment described above. As shown in FIG. 10, at first, a semiconductor substrate 2 is provided such as a silicon substrate or a silicon-on-insulator (SOI) substrate, etc. A dielectric material 4, a first polysilicon material 6, and a silicon nitride material 8 are then formed on the semiconductor substrate 2 in sequence. Subsequently, photolithographic processes and etching processes are performed to etch through a portion of the hard mask layer 8, such as the silicon nitride material 8, first polysilicon material 6, dielectric material 4, and to etch a portion of the semiconductor substrate 2, are patterned so as to form a trench 10 in the semiconductor substrate 2.

Figure 11:
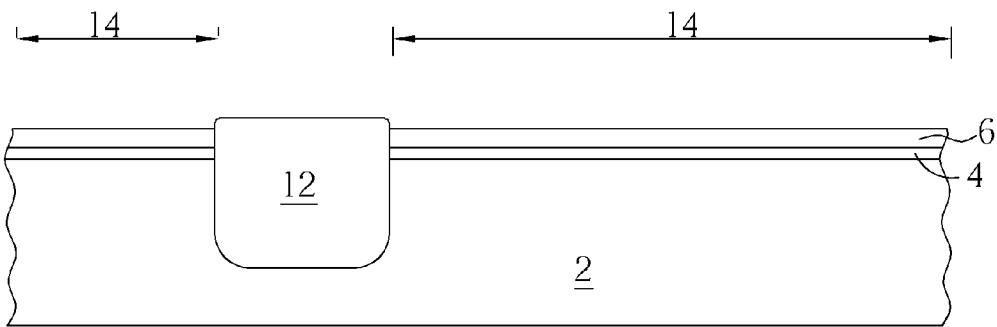

Next, the trench 10 is filled with an isolating material, such as silicon oxide component or silicon nitride component. At least a planarization process such as a chemical mechanical polishing (CMP) process, which uses the silicon nitride hard mask material 8 as a planarizing stop layer, is performed. The hard mask silicon nitride material 8 is then removed. Therefore an isolation region 12 is formed within the trench 10 as shown in FIG. 11. Among which, a portion of the semiconductor substrate 2, where the isolation region 12 is not included in, is defined as an active region 14. Afterwards, a plurality of ion implantation processes, such as well implantation processes, or channel implantation processes, etc, may be carried out to form the demanded doped regions, such as N-type well regions and P-type well regions, so as to define at least an N-type transistor region and at least a P-type transistor region (not shown).

Figure 12:
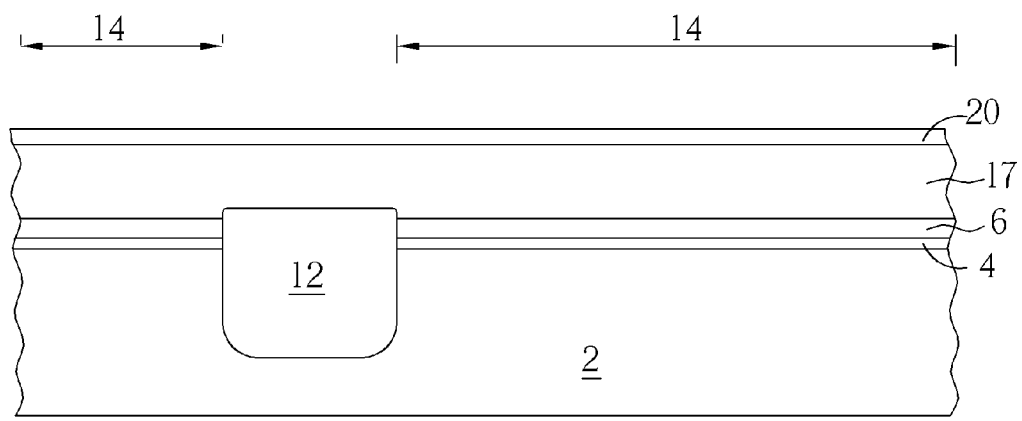

As shown in FIG. 12, a second polysilicon material 17 is formed on the first polysilicon material 16; and a hard mask material 20 is formed on the second polysilicon material 17. It should be notice that first and second polysilicon material 6, 17 may be doped polysilicons formed by in-situ or ex-situ doping process, or un-doped polysilicons. Besides, the hard mask materials 8, 20 may be composed of silicon nitride (SiN), silicon oxy-nitride (SiON), or silicon carbide (SiC) with higher etching-selectivity to silicon.

Figure 13:
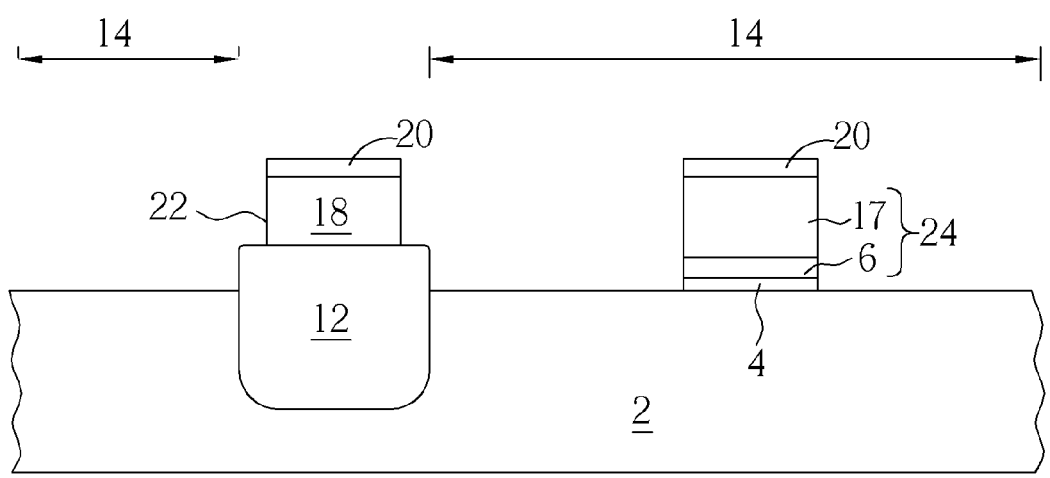

As shown in FIG. 13, photolithographic processes and etching processes are performed to etch the hard mask material 20, the second polysilicon material 17, and the dielectric material 4, so as to form at least a second gate 22 and a first gate 24 on the semiconductor substrate 2 on the isolation region 12 and at least a gate 24 on the active region 14, so as to form at least a gate 22, 24 on the isolation region 12 and the active region 14, respectively, and hard mask layers 20 on the gates 22, 24, respectively. Among which, the first gate 24 is on the active region 14 and the second gate 22 is at least partially across on the isolation region 12. The first gate 24 on the active region 14 includes a dielectric layer 4 on the semiconductor substrate 2, a first polysilicon layer 6 on the dielectric layer 4, and a second polysilicon layer 33 on the first polysilicon layer 6. The second gate 22 comprises a polysilicon layer 18, which is formed by etching the second polysilicon material 17.

Afterwards, an ion implantation process is performed to form lightly doped regions at the suitable positions within the semiconductor substrate 2 (not shown). It should be noticed that the gate 24 on the active region 24 may be an N-type gate or a P-type gate having different functions according to different integrated circuit designs (not shown). Furthermore, at least an N-type gate and at least a P-type gate (not shown) may be formed on the N-type transistor region and the P-type transistor region (not shown), respectively according to different integrated circuit designs and demands. In addition, the second gate 22 on the isolation region 12 is an extended portion of a gate of an adjacent transistor, a bridge portion between two gates of two adjacent transistors, an extending portion of a gate for improving line-end shortening effect, or just a linear segment of non-polysilicon or polysilicon used just as a resistor. The second gate 22 is not limited to be set all on the isolation region 12; it may also be set both across on a portion of the isolation region 12 and a portion of the active region 14. It should be noticed that although the second gate 22 is denominated "gate", it is not necessary to have the structure and the functions of a transistor. The term of gate here only refers to a patterned non-polysilicon, polysilicon, or metal segment.

Subsequently, the processes the same as those shown in FIG. 4 to FIG. 9 are performed. Finally, with the same result as shown in FIG. 9, a second metal gate structure 66, and a first metal gate structures 66, 68 are formed on the isolation region 12 and the active region 14, respectively. The second metal gate structure 66 includes a gate dielectric layer 58 and a metal layer 62; and the first metal gate structure 68 includes a gate dielectric layer 60 and a metal layer 64. Preferably, the height of the first metal gate structure 66 on the active region 14 and the height of the second metal gate structure 68 on the isolation region 12 are different. The details of which are not further described herein for the sake of brevity.

The present invention provides a method of fabricating a gate structure, and more particularly, to a method of fabricating a metal gate structure. The method combines the metal gate with the current manufacture process of the MOS transistor. Therefore, a MOS transistor having the advantages of a metal gate, which overcomes the problems of a polysilicon gate such as a depletion effect, and boron penetrates through the channel, etc, is obtained by the conventional fabrication technology. Additionally, in the first preferred embodiment of the present invention, a planarization process is carried out to form a planarized polysilicon layer before forming the gate; therefore, the height of the gate on the isolation region and the height of the gate on the active region are substantially the same. Furthermore, in the second preferred embodiment of the present invention, another polysilicon material is used to achieve the same result described above.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a metal gate structure, comprising:
    providing a semiconductor substrate;
    forming dielectric material, a first polysilicon material and a hard mask layer on the semiconductor substrate subsequently;
    forming at least a trench within the semiconductor substrate;
    filling the trench with an insulation material;
    planarizing the insulation material until exposing the hard mask layer to form an isolation region, and also defining at least an active region on the semiconductor substrate;
    forming a first gate and a second gate on the semiconductor substrate, wherein the first gate is on the active region and the second gate is partially set across on the isolation region; and
    replacing gate material of the first gate and the second gate with at least a metal material.

2. The method of claim 1, further comprising:
    removing the hard mask layer to expose the first polysilicon material;
    forming a second polysilicon material on the semiconductor substrate; and
    patterning the first polysilicon material and the second polysilicon material form at least the first gate and the second gate on the semiconductor substrate, wherein the first gate is on the active region and the second gate is partially set across on the isolation region.

3. The method of claim 1, wherein replacing the gate materials of the first gate and the second gate comprising:
    forming an inter-layer dielectric material on the semiconductor substrate:
    planarizing the inter-layer dielectric material until exposing the first gate and the second gate and forming an inter-layer dielectric layer;
    performing an etching process to remove the first gate and the second gate to form a first recess and a second recess corresponding respectively to the first gate and the second gate within the inter-layer dielectric layer;
    forming a gate dielectric material on a surface of each of the first recess and the second recess; and
    filling the first recess and second recess with at least the metal material.

4. The method of claim 1, wherein bottom surfaces of the first gate and the second gate are not coplanar.

5. The method of claim 1, wherein heights of the first gate and the second gate are different.

6. The method of claim 1, where the dielectric material is a high-K dielectric material.

7. The method of claim 3, after removing the gates, comprises;
    removing the dielectric material; and
    forming the gate dielectric material.

8. The method of claim 7, wherein the gate dieletric material is a high-K dielectric material.

9. The method of claim 7, wherein the gate dielectric material comprises another dielectric material and a high-K dielectric material.

10. The method of claim 3, wherein the etching process comprises a dry etching process or a wet etching process.

11. The method of claim 1, wherein the at least a metal material is an N-type metal material, and the N-type metal material comprises titanium aluminum nitride (TiAlN), tantalum carbide (TaC), tantalum nitride (TaN), or an arbitrary combination of titanium aluminum nitride (TiAlN), tantalum carbide (TaC), and tantalum nitride (TaN).

12. The method of claim 1, wherein the at least a metal material is an P-type metal material, and the P-type metal material comprises titanium nitride (TiN), tungsten (W), tungsten nitride (WN), molybdenum nitride (MoN), molybdenum aluminum nitride (MoAlN), or an arbitrary combination of titanium nitride (TiN), tungsten (W), tungsten nitride (WN), molybdenum nitride (MoN), and molybdenum aluminum nitride (MoAlN).

13. The method of claim 3, wherein the metal material formed within the first recess is a P-type metal material which comprises titanium nitride (TiN), tungsten (W), tungsten nitride (WN), molybdenum nitride (MoN), molybdenum aluminum nitride (MoAlN), or an arbitrary combination of titanium nitride (TiN), tungsten (W), tungsten nitride (WN), molybdenum nitride (MoN), and molybdenum aluminum nitride (MoAlN); and the metal material formed within the second recess is an N-type metal material which comprises titanium aluminum nitride (TiAlN), tantalum carbide (TaC), tantalum nitride (TaN), or an arbitrary combination of titanium aluminum nitride (TiAlN), tantalum carbide (TaC), and tantalum nitride (TaN).

14. The method of claim 3, wherein the metal material formed within second recess is a P-type metal material which comprises titanium nitride (TiN), tungsten (W), tungsten nitride (WN), molybdenum nitride (MoN), molybdenum aluminum nitride (MoAlN), or an arbitrary combination of titanium nitride (TiN), tungsten (W), tungsten nitride (WN), molybdenum nitride (MoN), and molybdenum aluminum nitride (MoAlN); and the metal material formed within the first recess is an N-type metal material which comprises titanium aluminum nitride (TiAlN), tantalum carbide (TaC), tantalum nitride (TaN), or an arbitrary combination of titanium aluminum nitride (TiAlN), tantalum carbide (TaC), and tantalum nitride (TaN).

15. A method of fabricating a metal gate structure, comprising:
    providing a semiconductor substrate;
    forming dielectric material, a first polysilicon material and a hard mask layer on the semiconductor substrate subsequently;
    forming at least a trench within the semiconductor substrate;
    filling the trench with an insulation material;
    planarizing the insulation material until exposing the hard mask layer to form an isolation region, and also defining at least an active region on the semiconductor substrate;
    forming a first gate and a second gate on the semiconductor substrate, wherein the first gate is on the active region and the second gate is partially set across on the isolation region; and
    removing gate materials of the first gate and the second gate form a first recess and a second recess corresponding respectively to the first gate and the second gate.

16. The method of claim 15, further comprising:
    removing the hard mask layer to expose the first polysilicon material;
    forming a second polysilicon material on the semiconductor substrate; and
    patterning the first polysilicon material and the second polysilicon material to form at least the first gate and the second gate on the semiconductor substrate, wherein the first gate is on the active region and the second gate is partially set across on the isolation region.

17. The method of claim 15, wherein replacing the gate materials of the first gate and the second gate comprising:
    forming an inter-layer dielectric material on the semiconductor substrate;
    planarizing the inter-layer dielectric material until exposing the first gate and the second gate and forming an inter-layer dielectric layer;
    performing an etching process to remove the first gate and the second gate to form a first recess and a second recess corresponding respectively to the first gate and the second gate within the inter-layer dielectric layer;
    forming a gate dielectric material on a surface of each of the first recess and the second recess; and
    filling the first recess and the second recess with at least the metal material.

18. The method of claim 15, wherein the bottom surfaces of the first gate and the second gate are not planar.

19. The method of claim 15, wherein heights of the first gate and the second gate are different.

20. A method of fabricating a metal gate structure, comprising:
    providing a semiconductor substrate;
    forming dielectric material, a first polysilicon material and a hard mask layer on the semiconductor substrate subsequently;
    forming at least a trench within the semiconductor substrate;
    filling the trench with an insulation material;
    planarizing the insulation material until exposing the hard mask layer to form an isolation region, and also defining at least an active region on the semiconductor substrate;
    forming a first gate and a second gate on the semiconductor substrate, wherein the first gate is on the active region and the second gate is partially set across on the isolation region; and
    etching to remove gate materials of the first gate and the second gate to form a first recess and a second recess corresponding respectively to the first gate and the second gate.

21. The method of claim 20, further comprising:
    removing the hard mask layer to expose the first polysilicon material;
    forming a second polysilicon material on the semiconductor substrate; and
    patterning the first polysilicon material and the second polysilicon material to form at least the first gate and the second gate on the semiconductor substrate, wherein the first gate is on the active region and the second gate is partially set across on the isolation region.

22. The method of claim 20, wherein replacing the gate materials of the first gate and the second gate comprising:
    forming an inter-layer dielectric material on the semiconductor substrate;
    planarizing the inter-layer dielectric material until exposing the first gate and the second gate and forming an inter-layer dielectric layer;
    performing the etching process to remove the first gate and the second gate to form a first recess and a second recess corresponding respectively to the first gate and the second gate within the inter-layer dielectric layer;
    forming a gate dielectric material on a surface of each of the first recess and the second recess; and
    filling the first recess and the second recess with at least the metal material.

23. The method of claim 20, wherein the bottom surfaces of the first gate and the second gate are not coplanar.

24. The method of claim 20, wherein heights of the first gate and the second gate are different.

* * * * *